United States Patent
Okoroanyanwu et al.

(10) Patent No.: US 6,475,904 B2
(45) Date of Patent: *Nov. 5, 2002

(54) INTERCONNECT STRUCTURE WITH SILICON CONTAINING ALICYCLIC POLYMERS AND LOW-K DIELECTRIC MATERIALS AND METHOD OF MAKING SAME WITH SINGLE AND DUAL DAMASCENE TECHNIQUES

(75) Inventors: Uzodinma Okoroanyanwu, Mountain View; Ramkumar Subramanian, San Jose, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 67 days.

(21) Appl. No.: 09/204,166

(22) Filed: Dec. 3, 1998

(65) Prior Publication Data

US 2001/0012689 A1 Aug. 9, 2001

(51) Int. Cl.[7] .................... H01L 21/4763; G03C 5/00
(52) U.S. Cl. .................... 438/637; 438/638; 430/313; 430/317
(58) Field of Search .................... 156/628; 438/637, 438/638, 639, 640, 635; 257/759, 760; 430/270.1, 313, 317

(56) References Cited

U.S. PATENT DOCUMENTS

| | | | | |
|---|---|---|---|---|
| 4,702,792 A | * | 10/1987 | Chow et al. | 156/628 |
| 4,764,247 A | * | 8/1988 | Leveriza et al. | 156/643 |
| 4,808,511 A | * | 2/1989 | Holmes | 430/325 |
| 5,487,967 A | * | 1/1996 | Hutton et al. | 430/322 |
| 5,877,075 A | * | 3/1999 | Dai et al. | 438/597 |
| 5,906,911 A | * | 5/1999 | Cote | 430/312 |
| 6,017,680 A | * | 1/2000 | Hattori et al. | 430/313 |
| 6,028,153 A | * | 2/2000 | Jung | 430/270.1 |
| 6,045,967 A | * | 4/2000 | Jung et al. | 430/270.1 |
| 6,103,445 A | * | 8/2000 | Okoroanyanwu et al. | 430/270.1 |
| 6,132,926 A | * | 10/2000 | Jung et al. | 430/270.1 |
| 6,294,314 B1 | * | 9/2001 | Liao | 216/49 |

FOREIGN PATENT DOCUMENTS

| | | | | |
|---|---|---|---|---|
| JP | 2-271359 | * | 11/1990 | G03F/7/38 |
| JP | 8-190204 | * | 7/1996 | G03F/7/32 |

OTHER PUBLICATIONS

Kaimoto, et al. "Silylation for Carboxylic Acids" Journal of Photopolymer Science and Technology 11(4), 1998, pp. 633–640.

Ohfuji et al. "Prospect and challenges of ArF excimer laser lithography processes and materials" Journal of Vacuum Science and Technology, B 14(6) (Nov/Dec) 1996, pp. 4203–4206.

Okoroanyanwu et al. "New single–layer positive photoresists for 193–nm photolithography" Proceedings of the SPIE, vol. 3049, Advances in Resist Technology and Processing XIV, published Jul. 1997, pp. 92–103.

Sasago et al. "Micro–processing by ArF excimer laser" Review of Laser Engineering 26(6), Jun. 1998, pp. 421–425.

* cited by examiner

*Primary Examiner*—Olik Chaudhuri
*Assistant Examiner*—Erik Kielin

(57) ABSTRACT

A damascene structure and method of making the same in a low k dielectric material employs an imageable layer in which the damascene pattern is provided. The imageable layer is an alicyclic polymer into which silicon is incorporated by liquid silylation, for example. The silicon-rich regions are converted upon exposure to the plasma etch that etches the low k dielectric material into a hard mask containing silicon dioxide, for example. The low k dielectric material is protected from further etching by the mask thus created.

17 Claims, 10 Drawing Sheets

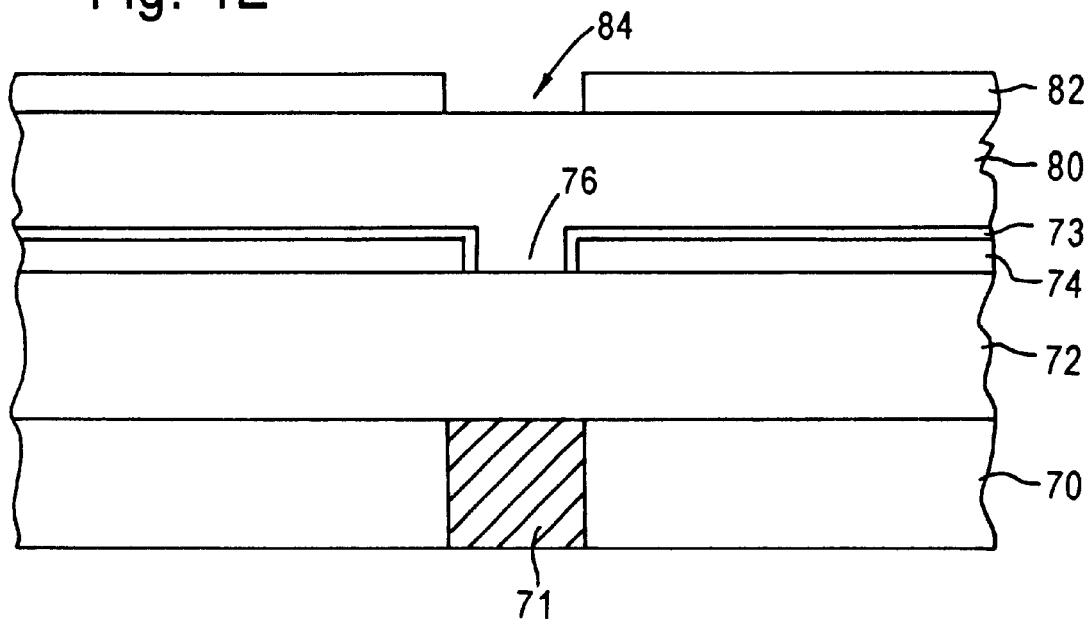
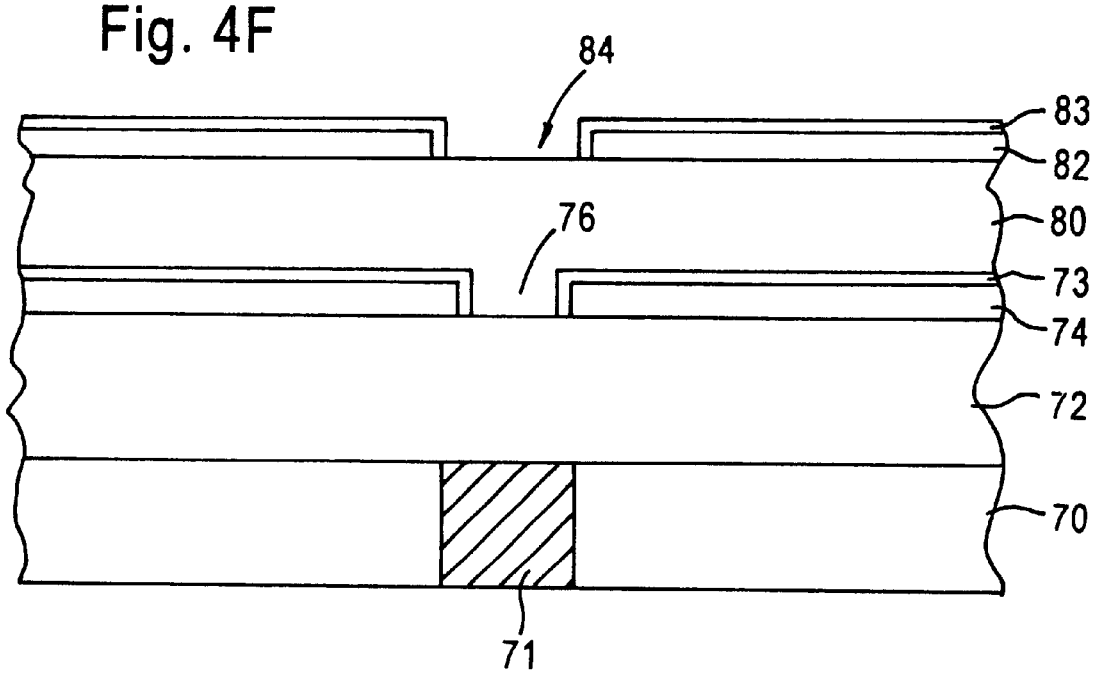

US 6,475,904 B2

INTERCONNECT STRUCTURE WITH SILICON CONTAINING ALICYCLIC POLYMERS AND LOW-K DIELECTRIC MATERIALS AND METHOD OF MAKING SAME WITH SINGLE AND DUAL DAMASCENE TECHNIQUES

RELATED APPLICATIONS

This application contains subject matter similar to that disclosed in U.S. application Ser. No. 09/143,105, filed on Aug. 28, 1998.

FIELD OF THE INVENTION

The present invention relates to the field of interconnects in semiconductor devices, and more particularly, to methods for forming single damascene and dual damascene structures in low dielectric constant materials.

BACKGROUND OF THE INVENTION

Integrated circuit fabrication typically begins with a thin, polished slice of high-purity, single crystal semiconductor material, usually silicon. Junctions (which make up devices) are formed between field oxide portions of the semiconductor slice. Metal lines in conductor layers provide necessary electrical connections between the devices. Dielectric (i.e. insulating) layers are formed between the conductor layers to isolate the metal lines from each other. Vias provide conducting paths through the dielectric layers to connect the interconnects of different conductor layers.

In high performance integrated circuits in the sub-0.25 $\mu$m regime, there is a need to fabricate interconnects using so-called damascene techniques. This is because conventional deposition and etching of aluminum-based metalization becomes increasingly difficult at these feature sizes. At the same time, performance considerations call for the use of lower resistivity metals such as copper, which has proven virtually impossible to pattern using conventional reactive ion etching. The desire to use copper for interconnects has increased the attractiveness of damascene techniques and spurred investigation into improving these techniques.

In addition to using low resistivity metals such as copper, circuit performance enhancement has been sought by combining the copper conductors with low dielectric constant insulators (k less than approximately 4). In many cases, these low k materials are spin coated polymers which are incompatible with conventional photoresist stripping using oxygen ashers or solvents. The patterning of the low k materials to form the trenches and vias of a damascene formation is a difficult task due to the incompatibility of the low k materials with conventional photoresist stripping.

An example of a single damascene process using a low k dielectric material is depicted in FIGS. 1A through 1D. A low k dielectric material 42 such as benzqcyclobutene (BCB), hydrogen silsesquioxane (HSQ) or the material known as FLARE (manufactured by Allied Signal) is spun on an interconnect layer 40. A cap layer 44 is then deposited on the low k dielectric layer 42. The cap layer 44 may be a 2000 Å thick layer of TEOS, or a multiple layer cap layer. For example, a multiple layer cap layer 44 may have a bottom 2000 Å thick TEOS layer, a 1000 Å thick nitride middle layer and a 800 Å thick top layer that is an organic bottom anti-reflective coating (BARC). A photoresist layer 46 is then deposited, leaving the structure of FIG. 1A.

The photoresist layer 46 is then patterned with the desired pattern and after developing, the cap layer 44 is etched, resulting in the structure of FIG. 1B. The etch recipe for the cap layer 44 is a different one than for the low k dielectric layer 42, which is an organic etch.

The photoresist layer 46 is then stripped off, using an appropriate oxygen ashing and/or solvent technique. This results in the structure of FIG. 1C. The cap layer 44 is used as a hard mask to pattern the low k dielectric layer 42 by an organic etch. This results in the structure of FIG. 1D. The cap layer 44 may be retained if it is TEOS only, although interconnect capacitance increases with TEOS thickness. The cap layer 44 is stripped if a multiple layer hard mask is employed.

An example of a dual damascene process sequence using a low k dielectric, having trenches with underlying via holes that are etched in the low k dielectric material before metal deposition and chemical-mechanical polishing (CMP), is depicted in FIGS. 2A–2D. This commonly used method of forming the trenches together with the via holes employs etch stop layers and photoresist masks. A bottom stop layer 14, such as silicon nitride, has been deposited over an existing interconnect pattern formed in an interconnect layer 10. The interconnect pattern may be formed from a conductor 12, such as copper. A layer of low k dielectric material 16 is then deposited on the bottom stop layer 14. The via will be formed within this low k dielectric layer 16.

A middle stop layer 18, such as silicon dioxide, is deposited over the low k dielectric layer 16. A via pattern 20 is etched into the middle stop layer 18 using conventional photolithography and appropriate anisotropic dry etching techniques. (These steps are not depicted in FIG. 2A. Only the resultant via pattern 20 is depicted in FIG. 2A.) The photoresist used in the via patterning is removed by an oxygen plasma, which consumes some of the exposed low k material, as indicated in FIG. 2A.

FIG. 2B depicts the structure of FIG. 2A after a second layer 22 of low k dielectric material has been spin coated on the middle stop layer 18 and through the via pattern opening 20. The structure is planarized at the same time. Following the spin coating and the planarization of the low k dielectric layer 22 in which the trench will be formed, a hard mask layer 24 is deposited. The hard mask layer 24 may be silicon dioxide, for example.

The trench pattern is then formed in a photoresist layer (not depicted) which is aligned over the via pattern, using conventional photolithography. The structure is then exposed to an anisotropic dry etch configured to etch through the hard mask layer 24. The etch chemistry is then changed to one which selectively etches the low k dielectric material in the low k dielectric layer 22, but not the hard mask layer 24 nor the middle and bottom stop layers, 18 and 14. In this way, a trench 26 and a via 28 are formed in the same etching operation.

In most cases, the low k etch chemistry etches the photoresist at approximately the same rate as the low k dielectric. The thickness of the trench photoresist is selected to be completely consumed by the end of the etch operation, to eliminate the need for photoresist stripping. This results in the structure depicted in FIG. 2C, in which all of the photoresist has been stripped and the trench 26 and via 28 have been formed. The bottom stop layer 14 is then removed by a different selective dry etch chemistry designed not to attack any other layers in order to expose conductor 12 to which the via is making a connection. The resulting structure is depicted in FIG. 2D. The bottom stop layer is normally used to protect the pre-existing interconnect layer from oxidation or corrosion during dry etching. If such concerns do not exist, bottom stop layer 14 and the corresponding bottom stop etching step are omitted.

In the known single and dual damascene processing techniques described above, the low k dielectric material is protected during removal of the photoresist by a mask (or cap) layer, formed of silicon dioxide or TEOS, for example. The patterning of the mask layer involves the separate steps of depositing and patterning a photoresist, and using the patterned photoresist in the etching of the mask layer. Hence, the need to protect the low k material during photoresist removal and pattern the protective mask adds a number of steps to the manufacturing process and therefore increases cost.

SUMMARY OF THE INVENTION

There is a need for a method of producing damascene structures in an interconnect arrangement incorporating low k dielectric materials with a reduced number of process steps while still protecting the low k dielectric layers from unintended etching and removal.

This and other needs are met by the present invention which provides a method of forming a damascene structure in a semiconductor device comprising the steps of forming a first low k dielectric layer and depositing an imageable layer on the first low k dielectric layer. The imageable layer is patterned to create a pattern with an opening in the first imageable layer. Silicon is then incorporated into the pattern of the first imageable layer. At least a portion of the first imageable layer with the incorporated silicon is converted into a hard mask and is positioned to protect the first low k dielectric layer from being etched except through the opening.

In certain embodiments, the imageable layer is an alicyclic polymer. A liquid silylation step is performed to incorporate silicon (approximately 10%–30% by weight, depending on the silylating agent used) is incorporated into the alicyclic polymer. When exposed to the etching step that etches the first low k dielectric layer, the silicon-rich regions in the imageable layer are at least partially converted to silicon dioxide, which acts as a hard mask to protect the unexposed portions of the first low k dielectric layer. Hence, a simple oxygen plasma etch simultaneously is used in a single step to etch low k dielectric material and convert the silicon-rich regions of the imageable layer to a hard mask. Since the hard mask has a very high etch resistance, only a thin layer (e.g. about 250 nm) may be employed as the imageable layer. The imageable layer does not need to be stripped and can remain in place since it is a dielectric material itself. Also, since only a thin layer of the imageable layer is originally deposited, the interconnect capacitance will not be greatly increased by the retention of this layer within the interconnect structure. This compares favorably with prior art structures which employ silicon dioxide layers (such as TEOS) of 2,000 Å thickness that remain in place in the final arrangement.

The earlier stated needs are met by another embodiment of the present invention in which a dual damascene structure is created by forming a second low k dielectric layer on the first imageable layer. A second imageable layer is then deposited on the second low k dielectric layer. The second imageable layer is patterned to create a trench opening in the second imageable layer. At least a portion of the trench opening overlays the via opening. Silicon is then incorporated into the second imageable layer. The first and second low k dielectric layers are etched through the trench opening and the via opening. This etching process transforms the second imageable layer and portions of the first imageable layer exposed by the trench opening into hard mask regions.

The present invention has the advantage of reducing the number of process steps required to create a dual damascene structure while protecting the low k dielectric material in the arrangement. This is due to avoiding the use of conventional photoresist material and the stripping steps required to remove this material. Instead, a single imageable layer is used on the low k dielectric material that can be imaged into a pattern, and after a liquid silylation to incorporate silicon, the transformed the hard mask layer in the simultaneous step that the etching of the low k dielectric material through the opening in the imageable layer.

In addition to the methods for creating damascene structures provided by the present invention, the earlier stated needs are also met by an interconnect arrangement in a semiconductor device comprising a first low k dielectric layer and a first alicyclic polymer layer on the first low k dielectric layer. The first alicyclic polymer layer has a hard mask region. A via is formed in the first low k dielectric layer and a hard mask region in the first alicyclic polymer layer. A second low k dielectric layer is provided on the first alicyclic polymer layer. A second alicyclic polymer layer is on the second low k dielectric layer. The second alicyclic polymer layer has a hard mask region. A trench is formed in the second low k dielectric layer and the hard mask region in the second alicyclic polymer layer.

The interconnect arrangement of the present invention has a very thin layer separating the first and second low k dielectric layers, much thinner than prior arrangements which employ a silicon dioxide layer of approximately 2,000 Å. By reducing the thickness of the mask layer between the dielectric layers, the total capacitance of the interconnect arrangement is reduced according to the present invention. In certain preferred embodiments, the thickness of the imageable layer is about 250 nm.

Furthermore, the use of an imageable layer having regions that are convertible to a hard mask provides dual functionality in a single layer, (i.e. imaging and masking) to allow reduction in the number of processing steps and simplification of the procedure by which organic low k dielectric material is protected from consumption by exposure to oxygen. If conventional photoresist stripping is employed as in the prior art, for example, the organic low k dielectric material would be consumed without appropriate masking. This is avoided by the present invention in which the imageable layer protects the low k dielectric material and has portions that are actually converted into a hard mask during the process in which the low k dielectric material is etched.

The foregoing and other features, aspects and advantages of the present invention will become apparent from the following detailed description of the present invention when taken in conjunction with the accompanying drawings.

BRIEF DESCRIPTION OF THE DRAWINGS

FIGS. 4A–4H depict cross-sectional views of the interconnect portion of the semiconductor wafer during a manufacturing process thereof to form a dual damascene structure with trench and via formation in accordance with embodiments of the present invention.

DETAILED DESCRIPTION OF THE INVENTION

The present invention, with embodiments depicted in FIGS. 3A–3K and 4A–4H, provide processing sequences forming single damascene and dual damascene trench and via structures in low k dielectric materials. The embodiments of the present invention ensure that a low k dielectric material is not completely consumed during the patterning of the openings to be created, nor during the etching of the openings in the low k dielectric layers. This is accomplished through the use of a relatively thin, imageable layer formed on top of the low k dielectric layers, and into which silicon is incorporated by liquid silylation. The silylated imageable layer is then converted to a mask layer during the etching of the low k dielectric material.

Figure 1A:
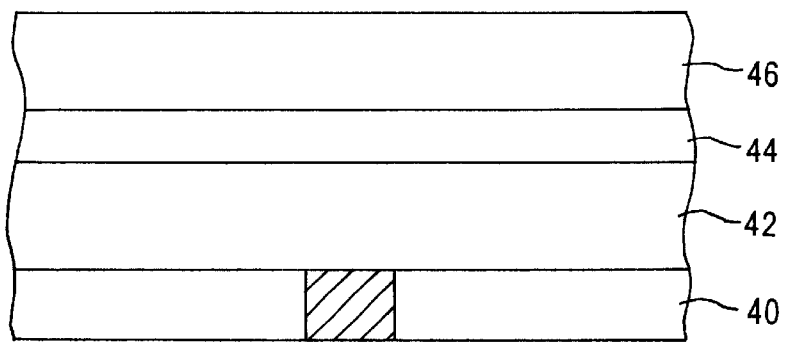
FIGS. 1A–1D depict a method of forming an opening in a low k dielectric material in accordance with known methods.
Figure 1B:
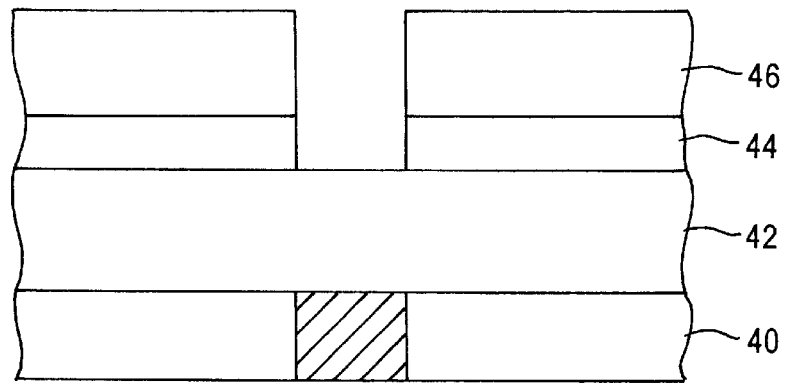
Figure 1C:
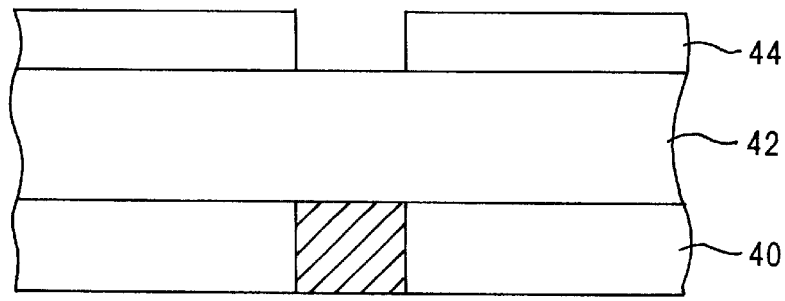
Figure 1D:
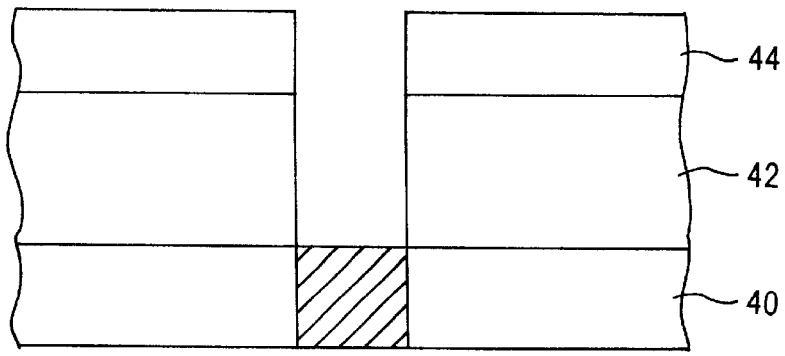
Figure 2A:
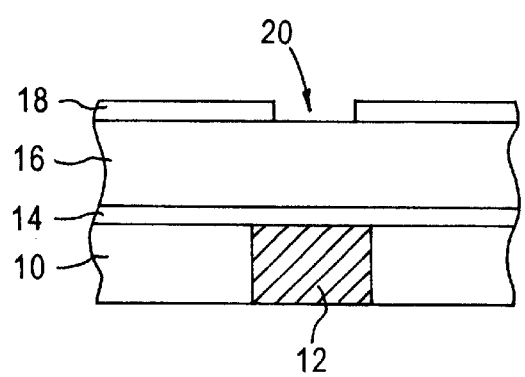
FIGS. 2A–2D depict a method of forming a dual damascene trench and via structure in a low k dielectric material in accordance with prior art methods of processing.
Figure 2B:
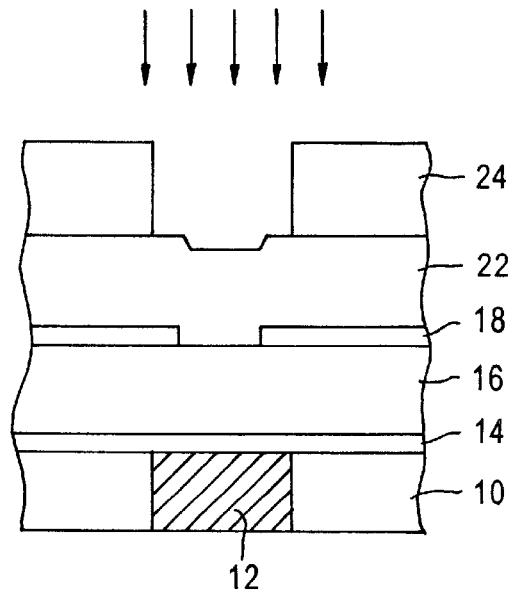
Figure 2C:
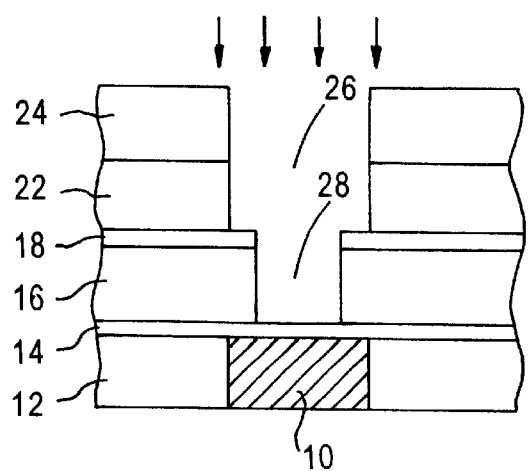
Figure 2D:
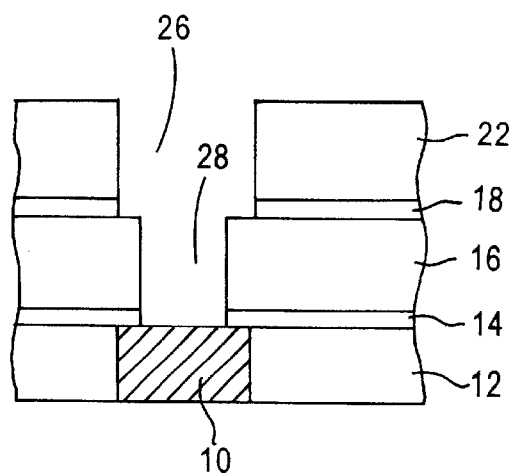
Figure 3A:
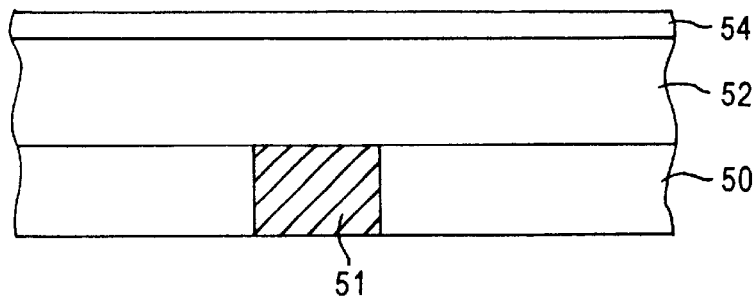
FIGS. 3A–3K depict cross-sectional views of the interconnect portion of a semiconductor wafer during a manufacturing process thereof to form a single damascene structure with trench and via formation in accordance with certain embodiments of the present invention.

A first embodiment of the present invention is depicted in FIGS. 3A–3K, which show a cross-section of a interconnect portion of a semiconductor wafer, for example as shown in FIG. 3A. A conductor 51 having a low resistivity, such as copper, is provided in an interconnect layer 50. A first low k dielectric layer 52 is then formed by spin coating, for example, low k dielectric material on the interconnect layer 50 and conductor 51. The first low k dielectric layer 52 may be made of a suitable material, such as benzocyclobutene (BCB), hydrogen silsesquioxane (HSQ) or the commercially known material FLARE, manufactured by Allied Signal. These materials are considered low k dielectric materials since their dielectric constant is less than about 4. Although these materials have proven advantageous in reducing the capacitance of the interconnect region, this class of materials is more difficult to work with since conventional techniques for removing photoresist (oxygen ashing or solvents) tend to consume the organic low k dielectric materials. Hence, during normal processing, low k dielectric layer 52 needs to be protected from oxygen ashing.

A thin layer 54 of an alicyclic polymer 54 is deposited on the low k dielectric layer 52. A suitable polymer, for example, is maleic anhydride containing alicyclic polymer. The planarizing layer typically found in a bilayer resist is not required in the present invention as the low k dielectric layer 52 serves in the capacity of a planarizing layer commonly found in the bilayer resists. Instead, the alicyclic polymer layer 54 serves as an imageable layer. The structures of exemplary suitable polymers are depicted later.

The low k dielectric 52 is typically deposited to a thickness of about 7,000 Å, and in the present invention, the thickness of the imageable layer 54 may vary from approximately 50 nm to 400 nm. This compares favorably with cap layers of approximately 2,000 Å of silicon dioxide that are used to cap low k dielectric layers in the prior art. The reduced thickness of the imageable layer 54 leads to a reduction in the overall capacitance of the interconnect layers.

Figure 3B:
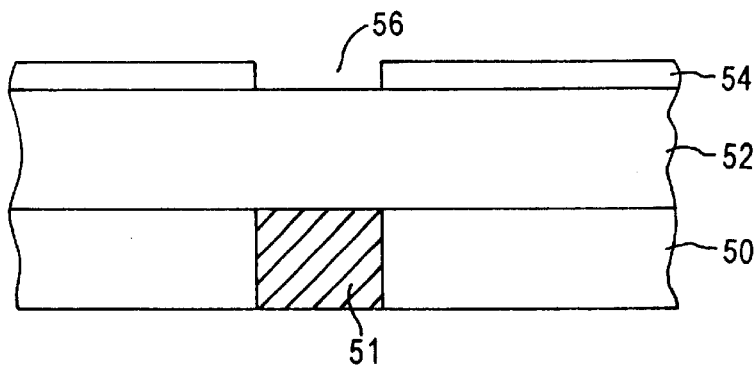

FIG. 3B depicts the cross-section of the interconnect structure after the imageable layer has been developed and patterned. A via pattern 56 has been patterned into the imageable layer 54 through conventional patterning and stripping techniques.

Figure 3C:
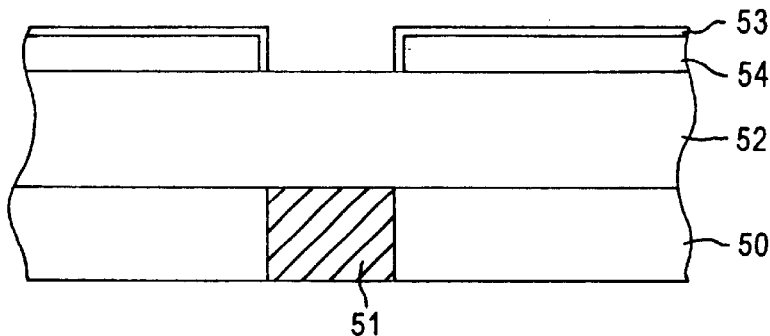

With the via pattern 56 now formed in the imageable layer 54, a liquid silylation step is performed to incorporate silicon into the imageable layer 54. In certain preferred embodiments of the invention, 10%–30% by weight of silicon is incorporated into the imageable layer 54. This creates a silicon-rich region 53 near the exposed areas of the imageable layer 54, as schematically depicted in FIG. 3C.

With the silicon now incorporated in the imageable layer 54, the low k dielectric layer 52 is now etched to create the via opening 58. The etching may be done, for example, using a single oxygen plasma etch. The oxygen plasma etch, in addition to etching the organic low k dielectric layer 52, will convert the silicon-rich regions 53 of the alicyclic polymer in the imageable layer 54 into silicon dioxide, thereby transforming the imageable layer 54 into a hard mask 55. A relatively thin layer, e.g. about 250 nm, may be employed since the hard mask 55 of the imageable layer 54 has a very high etch resistance. The resulting structure is depicted in FIG. 3D.

Figure 3D:
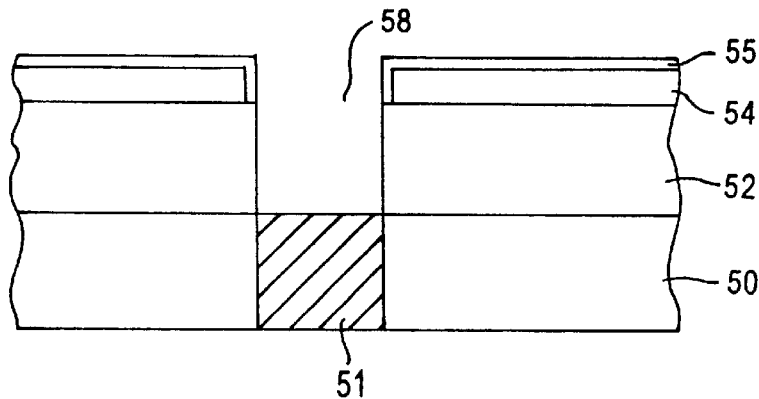
Figure 3E:
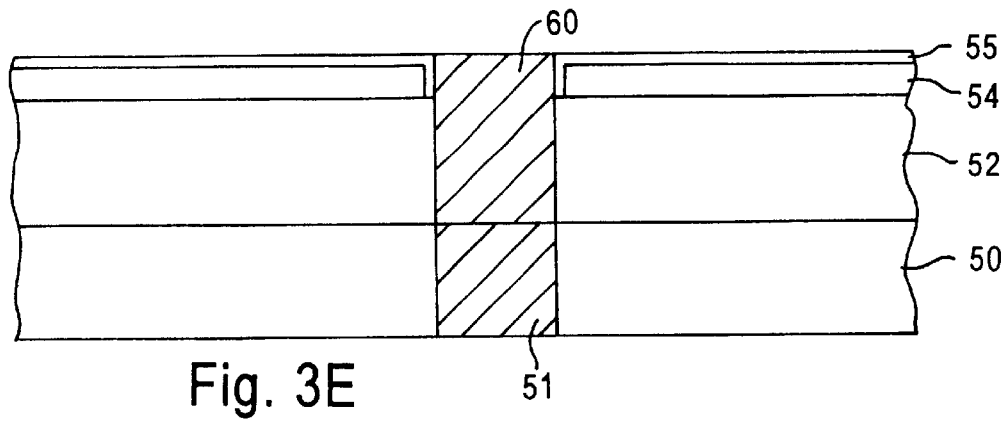

FIG. 3E depicts the structure of FIG. 3D after the via hole 58 has been filled with a conductive material to form a via 60. The filling of the via hole 58 with conductive material 60 may be performed in a conventional manner, such as by deposition of copper or tungsten, for example, with or without a barrier layer.

Figure 3F:
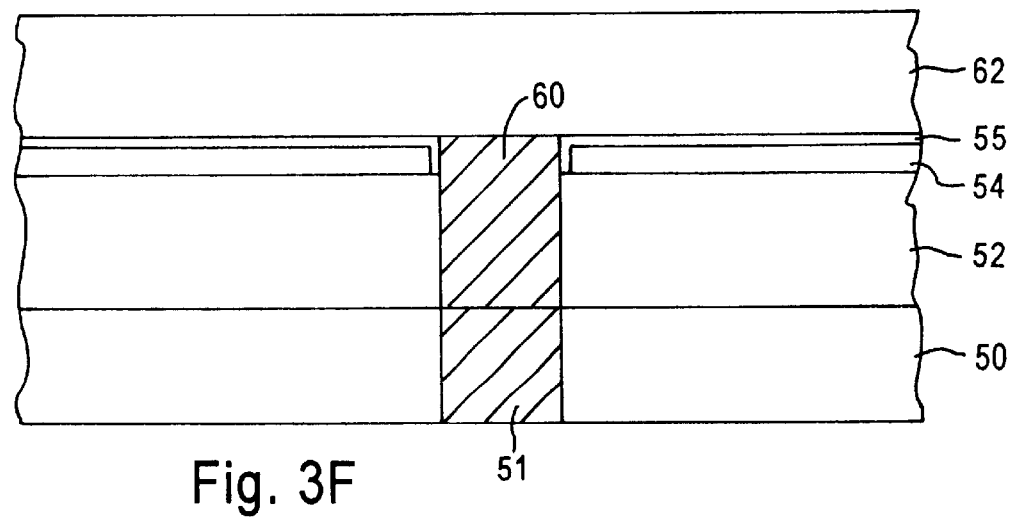

After formation of the via 60, a second low k dielectric layer 62 is spun on the hard mask 55 and the via 60 as seen in FIG. 3F. The hard mask 55 of the imageable layer 54, which was converted into silicon dioxide during the etching of the first low k dielectric layer 52, remains in place and is not stripped prior to formation of the second low k dielectric layer 62. This is because the hard mask 55 and the imageable layer 54 also form a dielectric layer, although with a higher dielectric constant than the low k dielectric material. However, the total capacitance of the interconnect layer is not greatly increased since only a thin layer (e.g. about 250 nm) is used. The material comprising the second low k dielectric layer 62 may be the same material comprising the first low k dielectric layer 52. In other words, an organic low k dielectric material such as BCB, HSQ or FLARE may be employed. It is preferable for efficient processing to employ the same low k dielectric materials in the first low k dielectric layer 52.

Figure 3G:
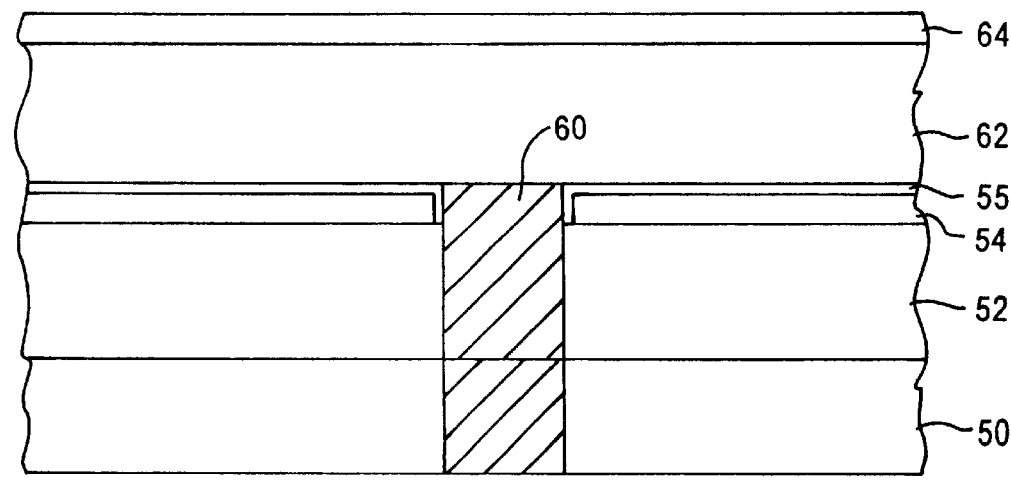

As done earlier for the first low k dielectric layer 52, a second imageable layer 64 is deposited on the second low k dielectric layer 62. This second imageable layer 64 may be made of the same alicyclic polymer as the first imageable layer 54 (which now includes hard mask 55). The second low k dielectric layer 62 may have a thickness of approximately 7,000 Å in preferred embodiments, while the thickness of the second imageable layer 64 may be approximately 250 nm in certain preferred embodiments of the invention. In other embodiments of the invention, the first and second imageable layers 54, 64, have thicknesses of less than 400 nm. The resulting structure is depicted in FIG. 3G.

Figure 3H:
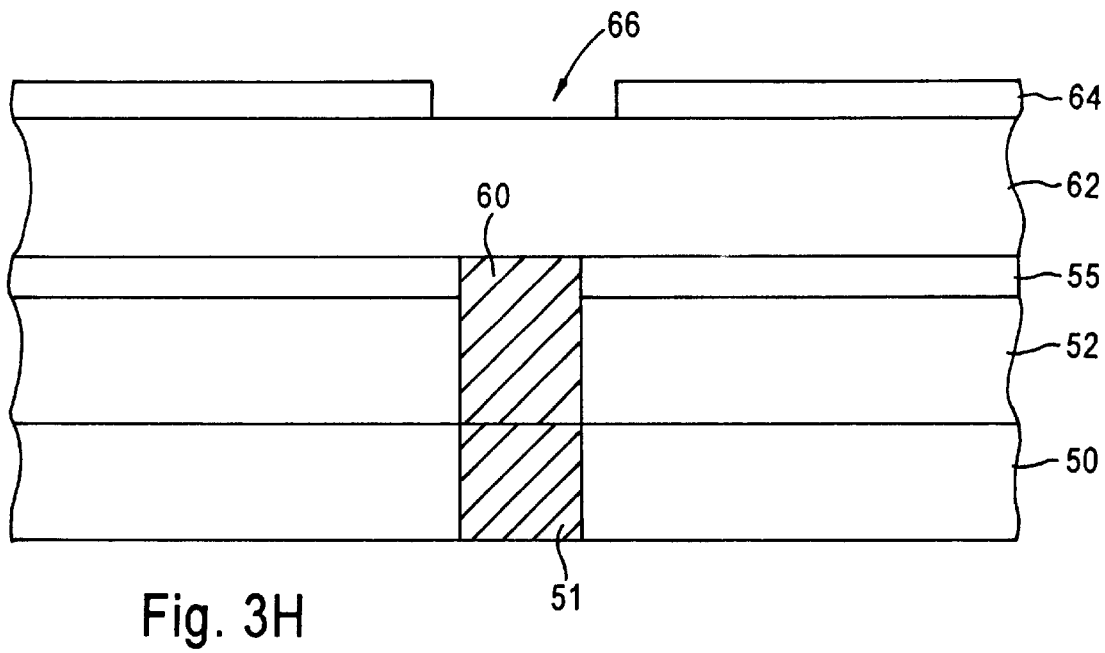

The second imageable layer 64 is patterned and developed as depicted in FIG. 3H, to provide a trench opening 66. The patterning process to create the trench opening 66 is selected so as not to attack the low k dielectric material in the second low k dielectric layer 62. The trench opening 66 at least partially overlays the via 60.

With the trench pattern 66 now formed in the imageable layer 64, a liquid silylation step is performed to incorporate silicon into the imageable layer 64. In certain preferred embodiments of the invention, 10%–30% by weight of silicon is incorporated into the imageable layer 64. This creates a silicon-rich region 63 near the exposed areas of the imageable layer 64, as schematically depicted in FIG. 3I.

Figure 3I:
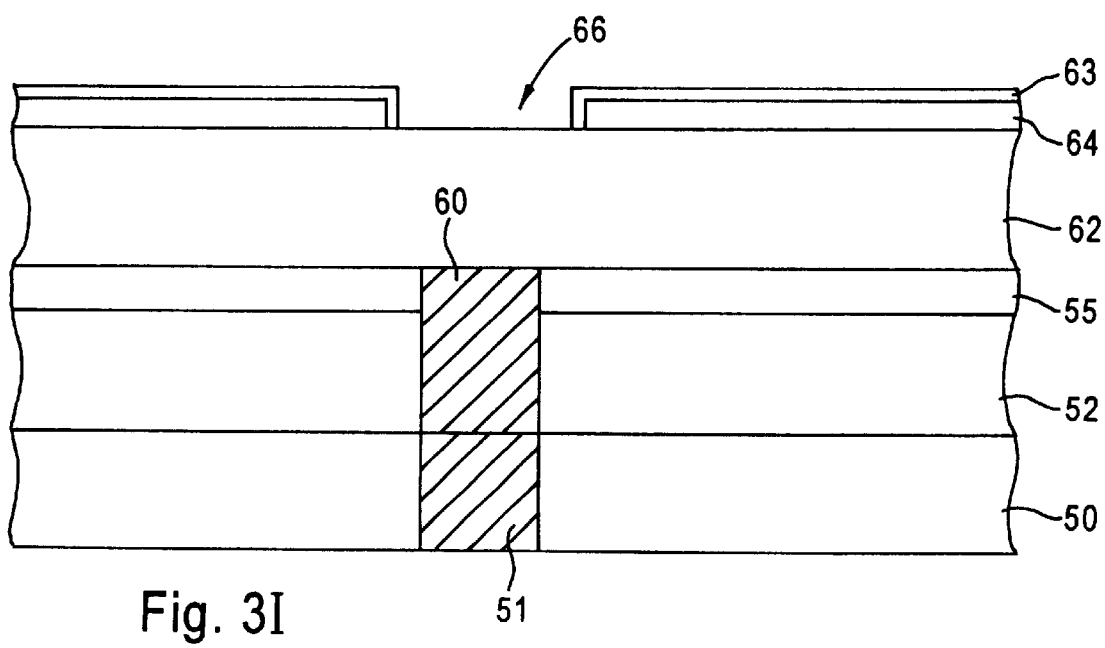
Figure 3J:
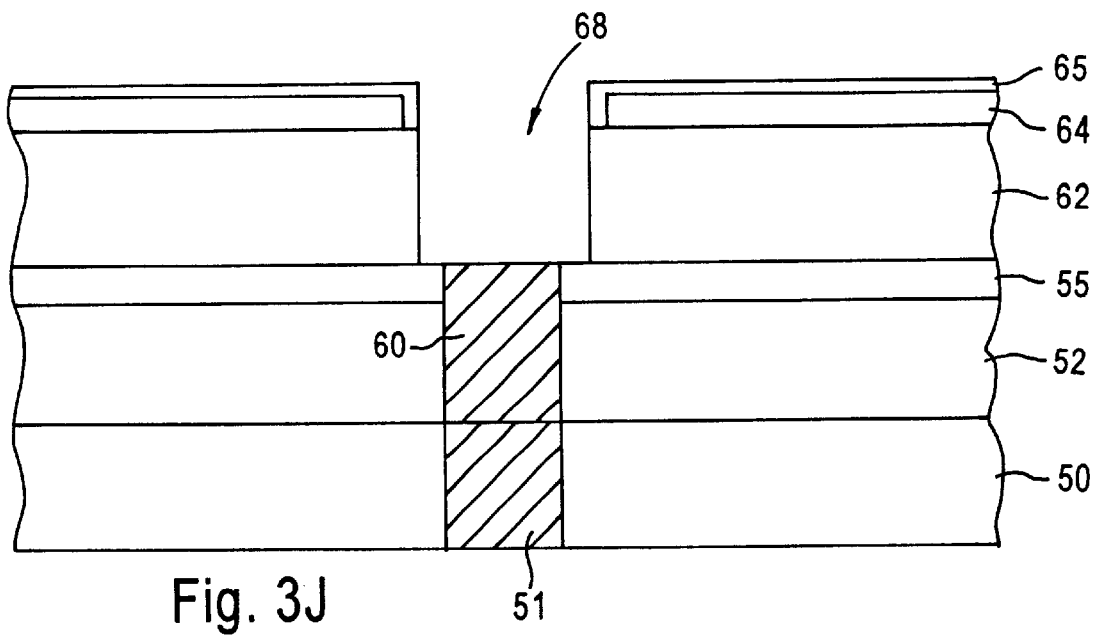

FIG. 3J depicts the structure of FIG. 3I following the etching of the second low k dielectric layer 62. An oxygen plasma etch is used as the etching chemistry in certain preferred embodiments. A trench 68 is created, and at the same time, the silicon-rich regions 63 of the second imageable layer 64 are converted into a hard mask 65 comprising silicon dioxide. This hard mask 65 serves to protect the low k dielectric material in the second low k dielectric layer 62 located immediately beneath the hard mask 65. Those portions of the second low k dielectric layer 62 not covered by the hard mask 65 are etched.

Figure 3K:
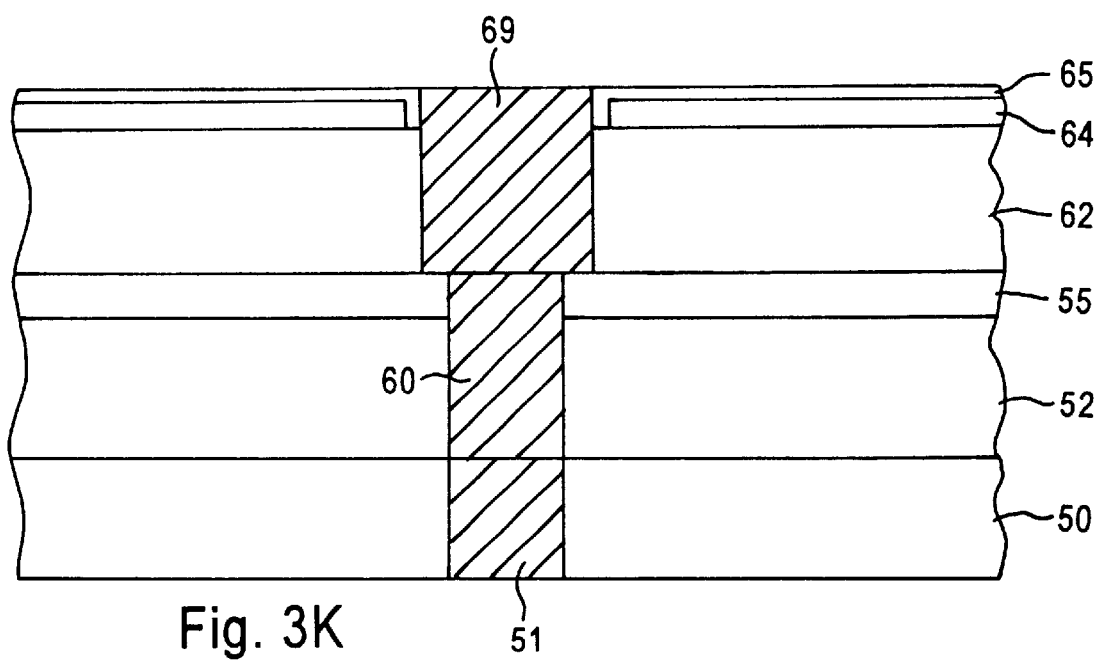

In order to complete the single damascene structure, conductive material is deposited within the trench opening 68 to form the trench 69. The conductive material may he a low resistivity material, such as copper, for example. The resultant structure is depicted in FIG. 3K.

One of the main advantages of the dual damascene technique over the single damascene technique is the etching of the dielectric layers in a single step, and the filling of the trench and via with conductive materials in a single step, thereby reducing the total number of steps employed in the damascene process. Certain embodiments of the present invention provide a method of forming the interconnect structure using a dual damascene technique.

Figure 4A:
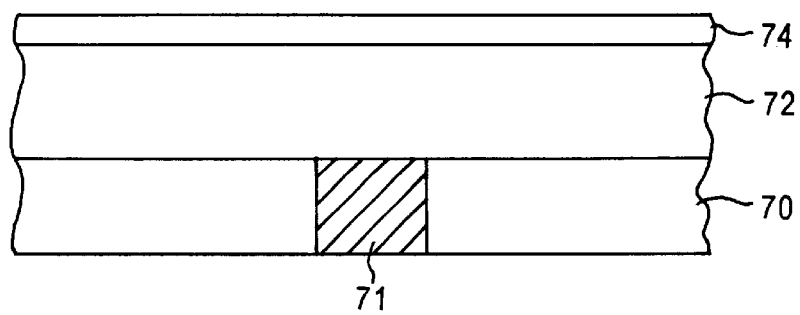

In FIG. 4A, a first dielectric layer 72 is formed (such as by spinning on) interconnect layer 70 having a conductor 71. The first imageable layer 74 is deposited on the first low k dielectric layer 72. In the exemplary embodiment of the dual damascene process of the present invention depicted in FIGS. 4A–4H, the same materials may be employed in the layers as already described with respect to the single damascene process depicted in FIGS. 3A–3K. Hence, the description of these materials with respect to the dual damascene process in FIGS. 4A–4H will not be provided.

Figure 4B:
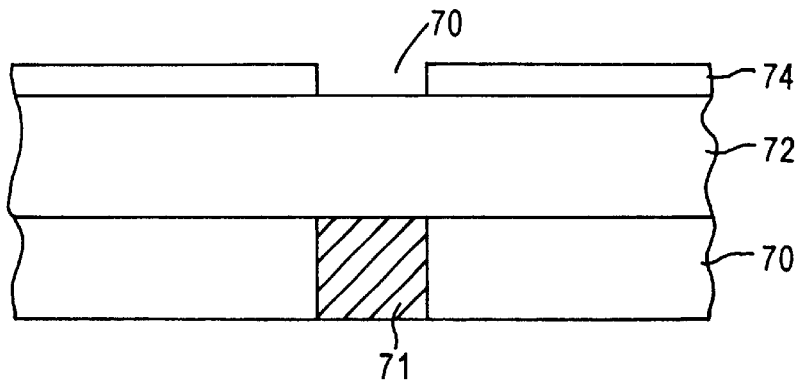
Figure 4C:
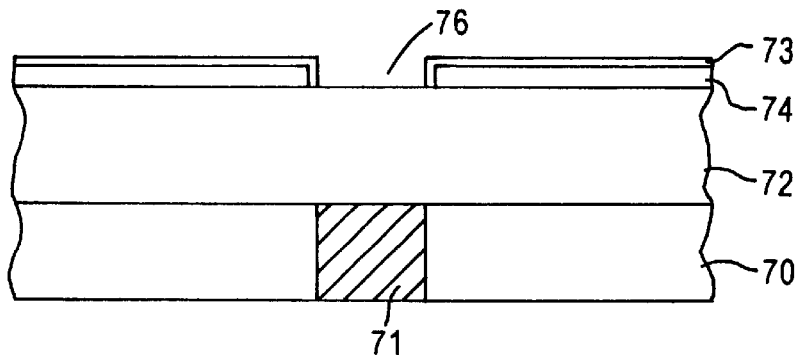

FIG. 4B depicts the structure of FIG. 4A after the first imageable layer 74 has been patterned to create a via pattern 76. Following the patterning and developing of the imageable layer 74, a liquid silylation step is performed to incorporate silicon (10%–30% by weight, for example) into the imageable layer 74. Silicon-rich regions 73 are thereby formed in the imageable layer 74, as depicted in FIG. 4C.

Figure 4D:
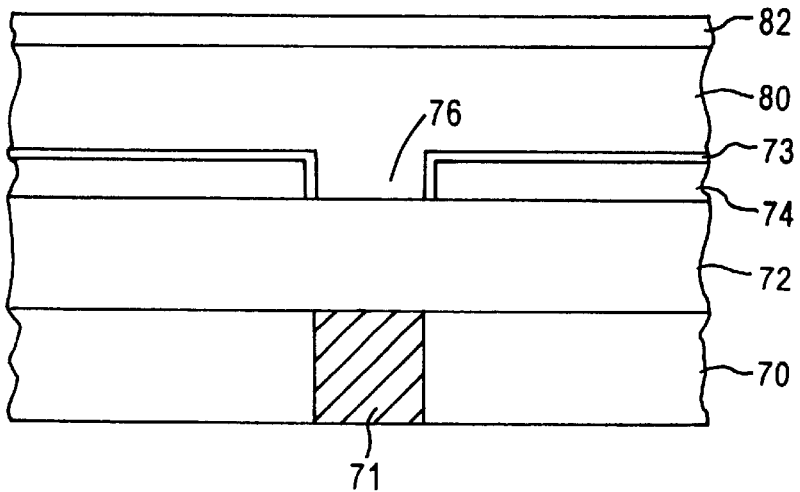

Instead of performing an oxygen plasma etch of the first low k dielectric layer 72 as done at this point in the single damascene process, a second low k dielectric layer 80 is deposited over the first imageable layer 74 and the first low k dielectric layer 72. Next, a second imageable layer 82 is deposited over the second low k dielectric layer 80. The thicknesses of the first and second low k dielectric layers 72, 80 may be approximately 7,000 Å each. The alicyclic polymer deposited to form the first and second imageable layer 74, 82 will be deposited to a thickness of less than 400 nm and more preferably to a thickness of about 250 nm each. The resultant structure is depicted in FIG. 4D.

The second imageable layer is patterned and developed, as depicted in FIG. 4E, to provide a trench opening 84 that at least partially overlays the via opening 76. The patterning of the second imageable layer 82 does not consume the low k dielectric material in the second low k dielectric layer 80. With the trench pattern 84 now formed in the imageable layer 82, a liquid silylation step is performed to incorporate silicon into the imageable layer 82. In certain preferred embodiments of the invention, 10%–30% by weight of silicon is incorporated into the imageable layer 82. This creates silicon-rich regions 83 near the exposed areas of the imageable layer 82, as depicted in FIG. 4F.

Figure 4G:
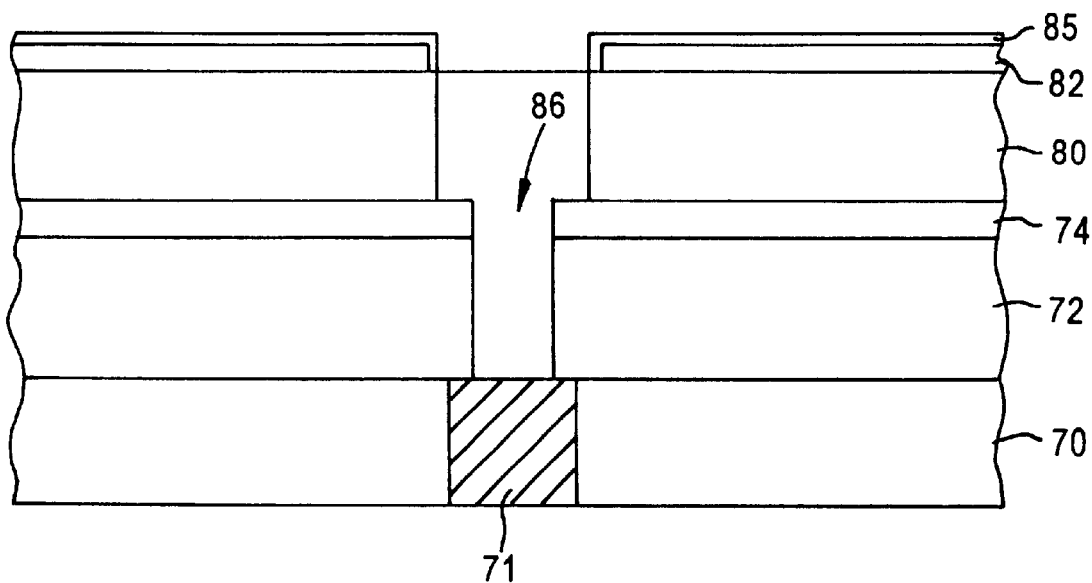

A single etching step is now performed to etch a via hole and trench 86 into the first and second low k dielectric layers 72, 80. The etch may be a simple oxygen plasma etch. At the same time, the oxygen reacts with the silicon-rich regions 83 of the second imageable layer 82 to create a hard mask 85 by converting the silicon-rich regions 83 into silicon dioxide. At least some of the exposed silicon-rich regions 73 of the first imageable layer 74 will also be converted to silicon dioxide and form a hard mask 75, although those portions of the silicon-rich regions 73 covered by the second low k dielectric layer 80 will not be so converted. The resultant structure is depicted in FIG. 4G.

Figure 4H:
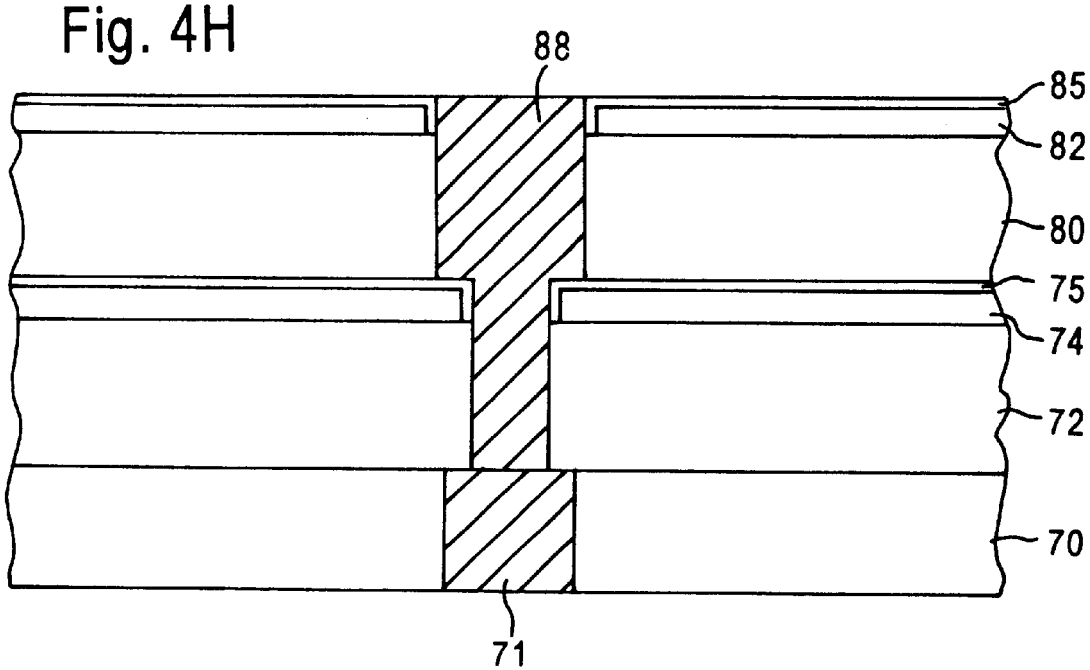

Following the etching through the first and second dielectric layers 72, 80 in a single step, the trench and via may be filled with conductive material 88 in a single step as well, as depicted in FIG. 4H. With the filling of the conductive materials 88, the formation of the dual damascene structure in the low k dielectric material is complete and further interconnect layers may be created on top of the damascene structure as desired.

Figure 5:
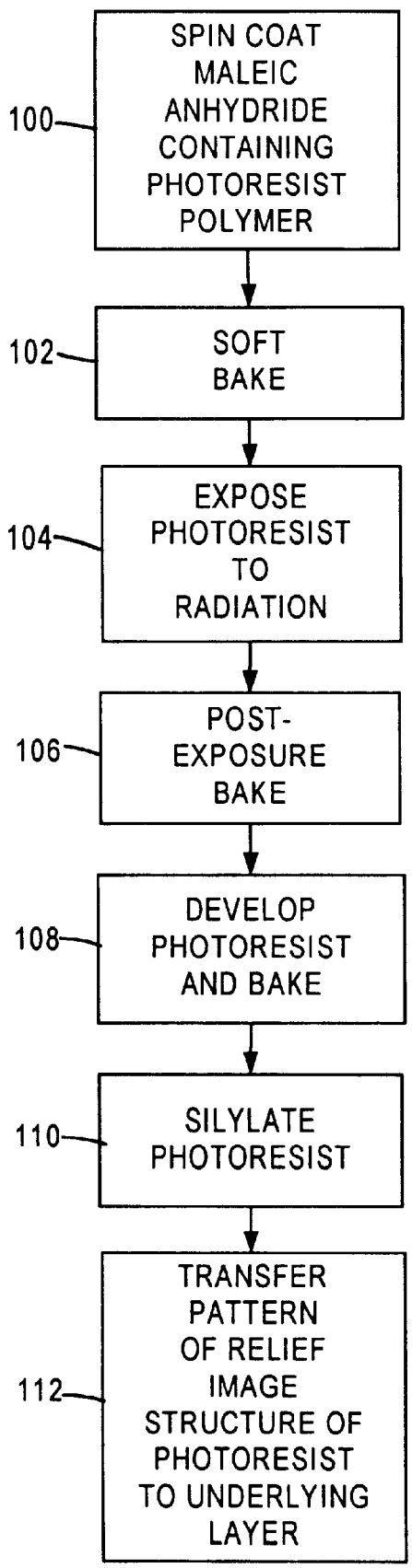
FIG. 5 depicts a flow chart of a process for integrating silicon containing alicyclic polymer low k dielectric materials into single and dual damascene interconnect structures in accordance with embodiments of the present invention.

FIG. 5 depicts a flow chart of a process for integrating silicon-containing alicyclic polymer low-k dielectric materials into single and dual damascene interconnect structures in accordance with embodiments of the present invention, and as described generally above. In step 100, the maleic anhydride containing photoresist polymer is spin coated on the layer of interest, such as the low k dielectric layers 52 and 62. Next, in step 102, a soft bake is performed at an appropriate temperature, for example, between about 120° C. and about 150° C.

The photoresist is then exposed to radiation, at wavelengths of 193 nm or 248 nm, for example, in step 104. In other embodiments of the present invention, the resists also find application in 157 nm and extreme-UV lithography (13.4 nm) using thin layer imaging schemes, since they exhibit significant absorption at those wavelengths.

Following the exposure to the radiation, a post-exposure bake of the photoresist is performed in step 106. An appropriate temperature for the bake is between about 120° C. and about 150° C. The photoresist is then developed (Step 108) using a metal-ion free developer, followed by baking at 110–120° C. to ensure the evaporation of any residual developer solvent and the ring closing reaction of the anhydride moeities. Development in aqueous solvent leads to the ring opening of the anhydride moeties.

In step 110, silylation is performed with aqueous-alcoholic solutions of bisamino-alkyl-siloxane at room temperature. In this step, silicon is incorporated into the photoresist patterns by means of a spontaneous reaction of the amine groups of the silylation agent with the anhydride substructures of the photoresist polymer resin. This leads to good etch resistance during oxygen RIE, film thickness increase and line width increase. A pattern transfer of the relief image structures of the photoresist layer is then performed in step 112 using oxygen reactive ion etching, for example.

An example of a liquid silylation scheme with ω ω'-bisamino-oligodimethyl siloxane is depicted below. This scheme is used in certain embodiments of the present invention.

An example of liquid silylation of poly(CBN-alt-MAH) using ω, ω' bisamino-propyloligodimethyl siloxane according to other embodiments of the present invention is depicted below.

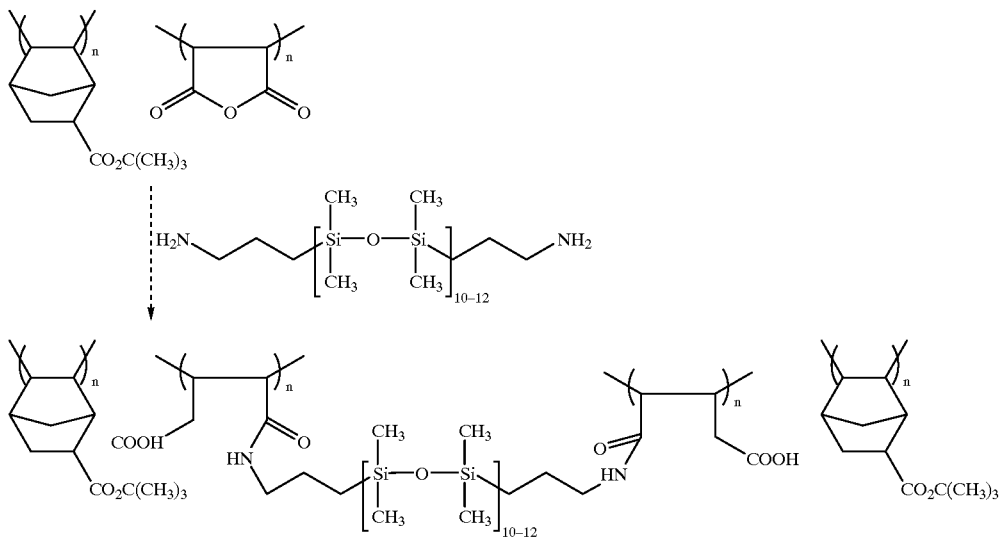

The following structures depict exemplary photoresist resins comprising maleic anhydride-containing alicyclic polymer. The chemistry of these polymers and the related ArF lithographic technologies can be found in the literature. Certain companies, such as Japan Synthetic Rubber Company and Clariant, are developing photoresist products based on some of these polymers for 193 nm lithographic applications. The chemistry and related process technologies dealing with liquid silylation of resist patterns can also be found in the literature.

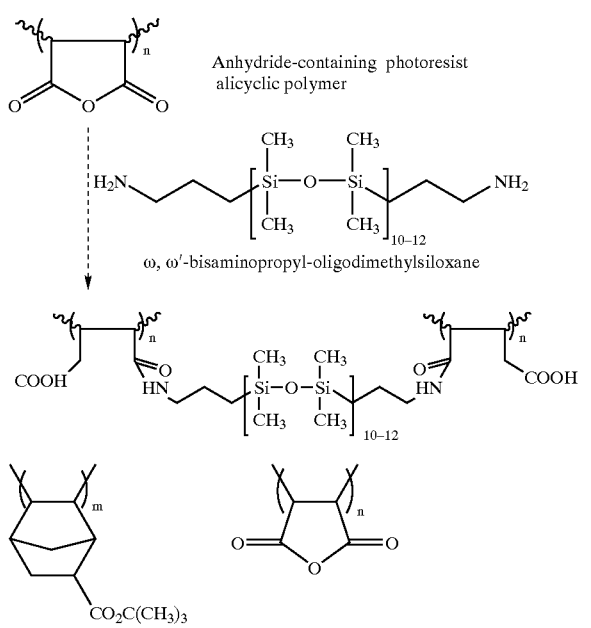

Polymer-1: Poly(2-methyl bicyclo[2.2.1]hept-2-ene-5-carboxylate-alt-maleic anhydride)

Polymer-2: Poly(2-methyl bicyclo[2.2.1]hept-2-ene-5-carboxylate-alt-maleic anhydride-alt-bicylo[2.2.1]hept-2-ene)

Polymer-3: Poly(tetracyclo[4.4.0]$^{2,5}$.1$^{7,12}$]dodec-3-ene-5-carboxylate-alt-maleic anhydride-alt-bicylo[2.2.1]hept-2-ene)

The present invention provides a reduced step process for creating damascene structures with low k dielectric materials. This is accomplished by employing an imageable layer into which silicon can be incorporated and then converted to a mask layer by the same etching chemistry used to etch the low k dielectric material. At the same time, the capacitance of the interconnect arrangement is not greatly increased, nor do the imageable layers need to be removed, since the layers may be made thin so as not to significantly increase the overall capacitance of the interconnect arrangement.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a damascene structure in a semiconductor device, comprising the steps of:
   forming a first low k dielectric layer;
   depositing an imageable layer comprising an alicyclic polymer on the first low k dielectric layer;
   patterning the first imageable layer to create a first patterned layer having an upper surface with an opening defined by side surfaces in the first patterned layer;
   performing liquid silylation of the first patterned layer to form a silicon-rich region on the upper surface and the side surfaces of the first patterned layer;
   etching the first low k dielectric layer through the opening while simultaneously converting the silicon-rich region into silicon dioxide which functions as a hard mask protecting the first low k dielectric layer from being etched except through the opening.

2. The method of claim 1, wherein the step of incorporating silicon includes performing liquid silylation on the first imagable layer.

3. The method of claim 1, wherein about 10% to about 30% silicon by weight is incorporated into the first imageable layer.

4. The method of claim 3, comprising etching the first low k dielectric layer with an oxygen plasma.

5. The method of claim 4, comprising etching the first low k dielectric layer to form a via hole in the first low k dielectric layer.

6. The method of claim 5, further comprising the steps of:
   filling the via hole with conductive material;
   forming a second low k dielectric layer on the first patterned layer and the conductive material in the via hole;
   depositing a second imageable layer comprising an alicyclic polymer on the second low k dielectric layer;
   patterning the second imageable layer to create a second patterned layer comprising an upper surface and a trench defined by side surfaces in the second patterned layer performing liquid silylation of the second patterned layer to form a silicon-rich region on the upper surface and the side surfaces of the second patterned layer; and
   etching the second low k dielectric layer through the opening while simultaneously converting the silicon-rich region into silicon dioxide which functions as as hard mask protecting the second low k dielectric layer.

7. The method of claim 6, comprising depositing each of the first and second imageable layers at a thickness about 50 nm to 400 nm thick.

8. The method of claim 7, wherein the first and second imagable layers are each between about 50 and 400 nm thick.

9. The method of claim 1, wherein the alicyclic polymer comprises maleic anhydride.

10. A method of forming a dual damascene structure in a semiconductor device, comprising the steps of:
    depositing a first imageable layer comprising an alicyclic polymer on a first low k dielectric layer;
    patterning the first imageable layer to create a first patterned layer having an upper surface and a via opening defined by side surfaces in the first patterned layer;
    performing liquid silylation the first patterned layer to form a silicon-rich region on the upper surface and side surface of the first patterned layer;
    forming a second low k dielectric layer on the first patterned layer;
    depositing a second imageable layer comprising an alicyclic polymer on the second low k dielectric layer;
    patterning the second imageable layer to create a second patterned layer having an upper surface and a trench defined by side surfaces in the second patterned layer, with at least a portion of the trench opening overlaying the via opening;
    performing liquid silylation of the second patterned layer to form a silicon-rich region on the upper surface and side surface of the second patterned layer; and
    etching the first and second low k dielectric layers through the trench opening and the via opening, while simultaneously transferring the silicon-rich regions on the first and second layers into the hard mask regions protecting the underlying low k dielectric layer.

11. The method of claim 10, wherein the first and second imagable layers comprise a photoresist containing maleic anhydride.

12. The method of claim 11, wherein the steps of incorporating silicon into the first and second imageable layers includes liquid silylating the first and second imagable layers.

13. The method of claim 11, comprising etching the first and second low k dielectric layers with an oxygen plasma.

14. The method of claim 13, comprising incorporating about 10% to about 30% silicon by weight into the first and second patterned layers during silylation.

15. The method of claim 14, comprising depositing each of the first and second imageable layers at a thickness of about 50 nm to about 400 nm.

16. The method of claim 15, comprising depositing each of the first and second imageable layers at a thickness of about 250 nm.

17. The method of claim 11, wherein the alicyclic polymer is contained in maleic anhydride.

* * * * *

UNITED STATES PATENT AND TRADEMARK OFFICE
CERTIFICATE OF CORRECTION

PATENT NO.    : 6,475,904 B2
DATED         : November 5, 2003
INVENTOR(S)   : Okoroanyanawu et al.

It is certified that error appears in the above-identified patent and that said Letters Patent is hereby corrected as shown below:

<u>Title page,</u>
Item [*] Notice, should read -- Subject to any disclaimer, the term of this patent is extended or adjusted under 35 U.S.C. 154(b) by 0 days --

Signed and Sealed this

Twenty-seventh Day of January, 2004

JON W. DUDAS
*Acting Director of the United States Patent and Trademark Office*